United States Patent
Kienzle et al.

(10) Patent No.: US 6,878,936 B2
(45) Date of Patent: Apr. 12, 2005

(54) APPLICATIONS OPERATING WITH BEAMS OF CHARGED PARTICLES

(75) Inventors: Oliver Kienzle, Aalen (DE); Rainer Knippelmeyer, Aalen (DE)

(73) Assignee: Carl Zeiss NTS GmbH (DE)

( * ) Notice: Subject to any disclaimer, the term of this patent is extended or adjusted under 35 U.S.C. 154(b) by 0 days.

(21) Appl. No.: 10/619,690

(22) Filed: Jul. 16, 2003

(65) Prior Publication Data

US 2004/0056193 A1 Mar. 25, 2004

(30) Foreign Application Priority Data

Jul. 18, 2002 (GE) .......................................... 102 32 689

(51) Int. Cl.[7] .......................... G01N 23/00; G21K 7/00
(52) U.S. Cl. .................................................. 250/310
(58) Field of Search .......................... 343/779; 250/310, 250/492.21, 492.1; 335/212; 378/150

(56) References Cited

U.S. PATENT DOCUMENTS

| | | | | |
|---|---|---|---|---|
| 5,015,080 A | * | 5/1991 | Cassarly et al. | ............ 359/196 |
| 5,719,623 A | * | 2/1998 | Kinoshita | ................ 348/215.1 |
| 6,252,412 B1 | | 6/2001 | Talbot et al. | |
| 6,265,719 B1 | * | 7/2001 | Yamazaki et al. | .......... 250/310 |
| 6,281,513 B1 | * | 8/2001 | Takenaka | ................ 250/492.22 |
| 2003/0066961 A1 | * | 4/2003 | Kienzle et al. | ............. 250/306 |
| 2004/0084621 A1 | * | 5/2004 | Kienzle et al. | ............. 250/310 |
| 2004/0105160 A1 | * | 6/2004 | Kienzle et al. | ............. 359/619 |
| 2004/0113092 A1 | * | 6/2004 | Knippelmeyer | ......... 250/396 R |

FOREIGN PATENT DOCUMENTS

| | | |
|---|---|---|
| DE | 199 44 857 A1 | 3/2001 |
| EP | 1 182 684 A2 | 2/2002 |
| WO | WO 01/22469 A1 | 3/2001 |

* cited by examiner

*Primary Examiner*—John R. Lee
*Assistant Examiner*—Johnnie L Smith, II
(74) *Attorney, Agent, or Firm*—Jones Day

(57) ABSTRACT

A particle-optical apparatus is proposed which comprises a particle-optical lens for deflecting a plurality of separate beam-charged particles which is provided by a plurality of finger electrodes provided along an opening of the lens.

40 Claims, 13 Drawing Sheets

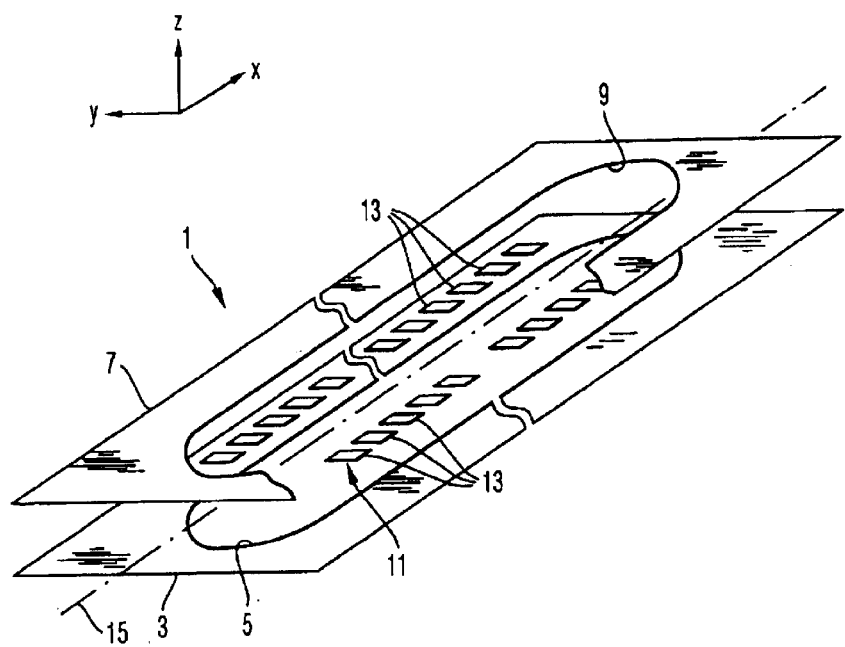
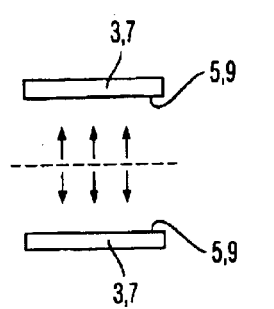 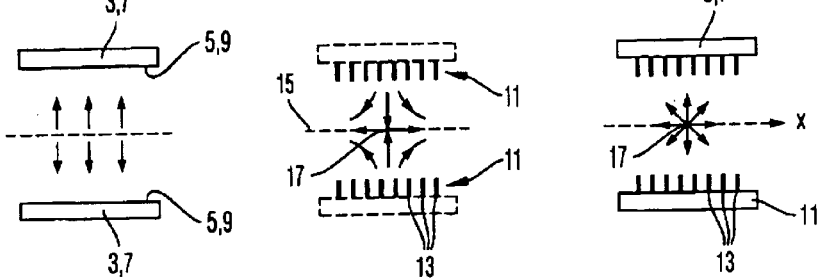 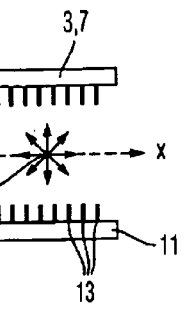
Fig. 2a   Fig. 2b   Fig. 2c

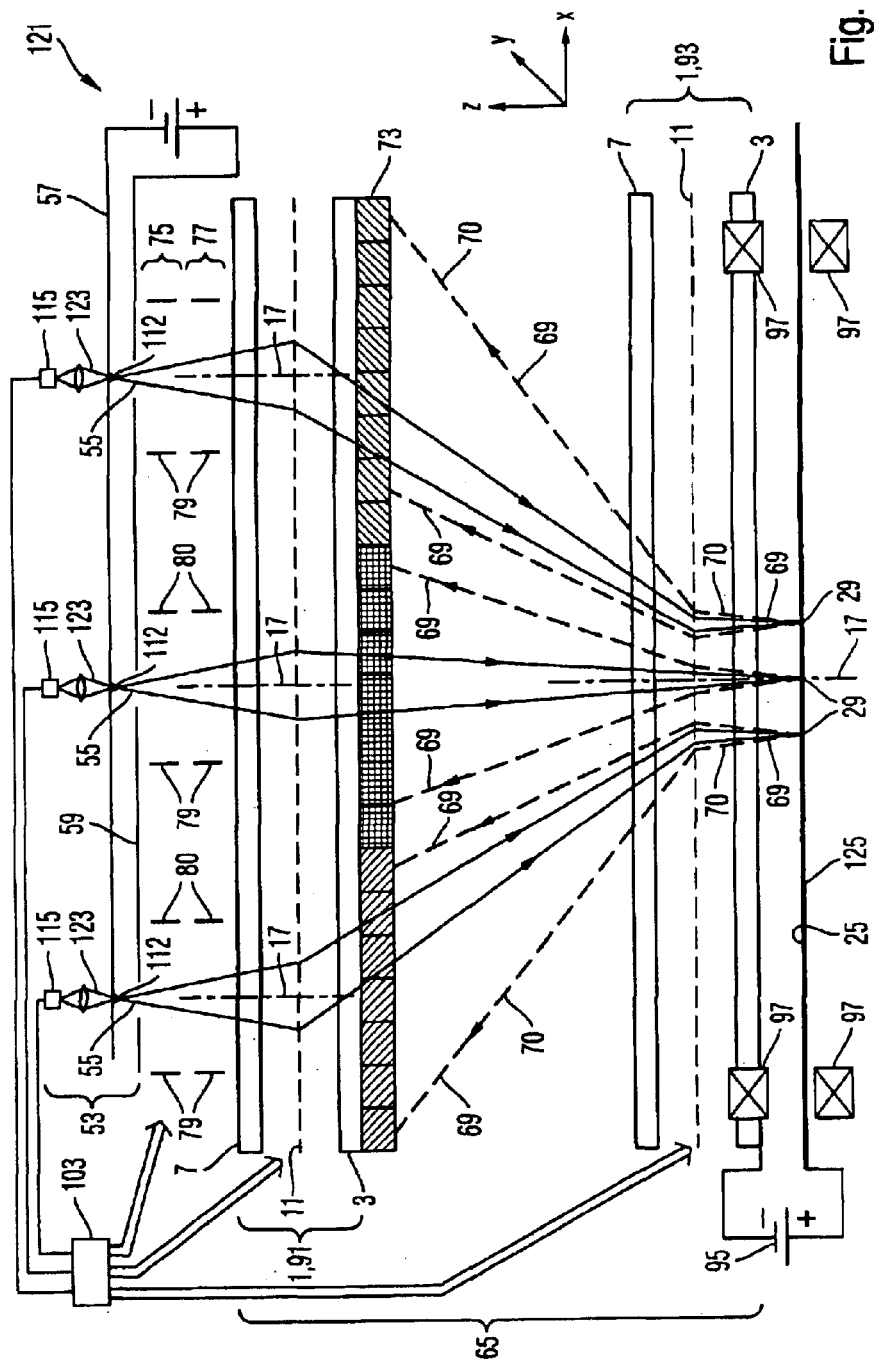

though parallel side-by-side to the wafer. Each of the plurality of electron microscopy apparatuses per se constitutes a separate and independently functioning electron microscope. The density of the packing of the plurality of electron microscopes is thus restricted by the transverse dimension of the individual electron microscopes.

APPLICATIONS OPERATING WITH BEAMS OF CHARGED PARTICLES

BACKGROUND OF THE INVENTION

1) Field of the Invention

The invention relates to applications which make use of beams of charged particles.

In particular, the invention relates to arrangements which guide and shape particle-optical beams, such as arrangements for deflecting, collimating and focusing beams of charged particles.

In particular, the invention also relates to microscopy systems and lithography systems which make use of beams of charged particles, in particular, electron beams for imaging structures.

2) Discussion of Related Art

From U.S. Pat. No. 6,252,412 B1 an electron microscopy apparatus for detecting defects in semiconductor structures is known. According to this document, the surface of a wafer is to be scanned within a minimum period of time in order to detect defects in the same as completely as possible. In order to increase the throughput, a plurality of electron microscopy apparatuses are disposed side-by-side so that a plurality of electron beams are directed parallel side-by-side to the wafer. Each of the plurality of electron microscopy apparatuses per se constitutes a separate and independently functioning electron microscope. The density of the packing of the plurality of electron microscopes is thus restricted by the transverse dimension of the individual electron microscopes.

SUMMARY OF THE INVENTION

It is an object of the present invention to provide apparatuses as an alternative thereto which operate with a plurality of beams of charged particles and, in so doing, to enable a higher density of beams, if required, or/and to produce the plurality of beams with components which are simplified in certain respects.

Moreover, it is an object of the invention to propose alternative particle-optical apparatuses and beam guidances which can be used as components or groups of structural components in particle-optical systems.

According to a first aspect, the invention relates to a particle-optical arrangement which can be used as scanning microscope apparatus (SEM). In a scanning microscope apparatus, a particle-optical image of an object is obtained in that a finely focused probe beam of charged particles is directed to the object which produces secondary particles at the object which are detected by a detector. Here, the position resolution of the image is obtained in that the position at which the probe beam impinges on the object is known and the detector signal is allocated to this position.

The particle-optical arrangement according to the invention, in particular, a scanning microscope apparatus, operates with a plurality of probe beams and correspondingly comprises two beam guiding arrangements, namely a first beam guiding arrangement for focusing the plurality of probe beams of charged particles substantially in an object plane, and a second beam guiding arrangement for guiding the secondary particles emanating from a region about the object plane as secondary beam to a detector arrangement. Here, the first and the second beam guiding arrangements can be integrated, that is, comprise common components for the beam guidance so that beam paths of the probe beams and the secondary beams traverse these common components and are partially superimposed.

Each beam guiding arrangement comprises one or more beam changing arrangements which act on the beams, for example, to collimate, to focus or to deflect the same or to correct or change specific features of the beams. It is provided for that at least one of these beam changing arrangements is integrally formed for the plurality of probe beams and secondary beams in that this beam changing arrangement comprises at least one structure with a coherent aperture for the plurality of probe beams and secondary beams, respectively, to pass freely therethrough.

In contrast to the conventional scanning microscopy apparatus with a plurality of probe beams, wherein for each probe beam a separate beam changing arrangement, such as an objective lens having a separate bore with magnetic coils disposed around said bore is provided, the arrangement according to the invention enables the beams to be disposed side-by-side in a density which is not restricted by the volume of the windings of adjacent objective lenses, because the plurality of beams are guided through a common opening or bore.

Furthermore, in the conventional microscopy apparatuses displacements of the probe beams are likewise restricted by the bores of the individual objective lenses. In the arrangement according to the invention, however, principally larger displacements are possible due to the plurality of beams being combined in a common opening.

Preferably, the first beam guiding arrangement comprises a beam deflector to displace the positions at which the probe beams are focused in the object plane and to thus "scan" the object plane and to obtain secondary particle intensities allocated to several positions.

The detector arrangement is provided such that for each probe beam the secondary particle intensity allocated to the same is detectable. To this end, the detector arrangement may comprise a plurality of separate detectors, each of which is allocated to one of the probe beams. This is particularly advantageous if the secondary beams generated by the individual probe beams are sufficiently spatially separated from each other.

However, it is also possible in this respect to provide for the plurality of secondary beams a common detector which can detect particle intensities in a position-sensitive manner. In this case, a controller is provided which identifies individual regions of the position-sensitive detector such that each region is allocated to one of the probe beams. In particular, it is then possible to take account of displacements of the secondary beams at the location of the detector which are due to displacements or deflections of the probe beams. Depending on the displacement, the controller can then allocate different regions of the detectors to the individual secondary beams.

Preferably, in the beam changing arrangement provides with the structure having the coherent aperture which is traversed by the plurality of beams constitutes a component of an objective arrangement for focusing the probe beams. In particular, the secondary beams pass through this objective arrangement as well.

Moreover, it is advantageous for such an objective arrangement and a beam deflector to be integrally formed in that the beam changing arrangement with the structure having the coherent aperture for the plurality of beams to pass through influences the same both in respect of a focusing and deflection thereof.

The particle-optical arrangement provided according to this aspect can also be used in a lithography system. In this case, the probe beams also have the function of writing beams in order to transfer a desired pattern on a particle-sensitive layer (resist), to which end the writing/probe beams are moved across the layer, i.e., the beams scan the layer and the beams are switched on and off in suitable manner in order to transfer the desired pattern. Here, the writing operation performed by the individual beams can be monitored by the detection of secondary electrons which are extracted by the individual writing/probe beams from the particle-sensitive layer. In particular, intensity fluctuations or changes of the writing beams can be detected in this way. The application is thus a lithography application, on the one hand, and a microscopy application, on the other hand.

Preferably, it is provided for that the beam deflector is also integrally formed with a collimating arrangement for collimating the probe beams in that the beam changing arrangement with the structure having the coherent aperture influences the plurality of beams both in respect of a deflection thereof and a collimation thereof.

Preferably, the coherent aperture of the beam changing arrangement is an elongated opening extending transversely to the direction of the beams. The structure is preferably formed as comb lens which comprises on both sides of a central axis of the elongated opening a row of several field source members spaced apart from the central axis. The field source members each produce an electric field or/and magnetic field, the electric and magnetic fields, respectively, produced by several field source members being superimposed in the opening and acting on the beams passing through the opening in correspondence to such superposition. In order to adjust source strengths of the individual field source members, preferably a driver arrangement is provided. It enables to produce suitable electric or/and magnetic fields within the opening by the superposition. Due to the plurality of field source members, there are provided a plurality of degrees of freedom in the generation of the field configurations of the superimposed field. For example, dipole fields, quadrupole fields, hexapole fields etc. as well as superpositions of the same can be provided which have a focusing, defocusing or deflecting effect on the beams in selected directions. In particular, the field source members can produce electric or/and magnetic fields.

An example of such a comb lens is known from German patent application DE 199 44 857 A1. According to this document, such a comb lens is used to approximate a focusing lens with an optical axis which is displaceable transversely to the beam direction. Accordingly, this conventional comb lens is combined with a beam deflector which deflects the particle beam transversely to the beam direction thereof, and the comb lens is dynamically controlled such that the optical axis of the focusing effect thereof substantially coincides with the displaced beam axis.

The inventors have now found that the application of such a comb lens is not limited to the focusing of dynamically displaced particle beams. Rather, such a particle-optical arrangement with an elongated opening is also advantageously applicable if an influence is to be imparted on a row of several separate beams of charged particles which travel along predetermined beam axes statically, i.e., stationarily in terms of time, and are not dynamically displaced.

According to a second aspect, the invention thus provides a particle-optical arrangement with a beam changing arrangement to act on a plurality of beams of charged particles. A beam guiding arrangement is provided to supply the plurality of beams to the beam changing arrangement such that they enter the beam changing arrangement along predetermined beam axes as beams which are separate and spaced from each other. To this end, the beam changing arrangement provides for each beam at least one spatial region of its own with an electric or/and magnetic field for influencing the beam entering this field region. In order to provide the plurality of field regions, the beam changing arrangement comprises at least one structure having a coherent aperture for a free passage of the plurality of beams.

Here, the structure can also be provided as a comb lens as described above.

The number of field source members per row is higher or equal to the number of the beams multiplied by two. Accordingly, the field for influencing each beam is formed by a superposition of fields produced by at least two field source members. It has been found that, in order to influence the beam with sufficient quality, it is not necessary to provide a particularly high number of field source members per beam. Good results can already be achieved with less than 15, preferably, less than 10, in particular, with 8, 7, 6, 5 or 4 or 3 field source members per beam.

Preferably, the beam guiding arrangement comprises a plurality of beam sources and a number of apertures fixedly disposed in respect of the beam sources in order to shape and separate the plurality of beams before they enter the beam changing arrangement.

According to a further aspect of the invention, use is made of a comb lens as particle-optical deflection arrangement. To this end, the source strengths of the individual field source members are adjusted such that, in the opening of the lens traversed by the beam, a dipole field deflecting the beam is locally produced by superposition of fields produced by several field source members. By use of the comb lens it is possible to produce such a dipole field locally, that is, not over the entire length of the opening so that corresponding field potentials are considerably reduced as compared to the generation of the fields over the entire opening. In this case, in particular, only a part of the source members is controlled or excited in longitudinal direction of the two rows in order to provide the dipole field.

In this respect, it is preferred for the field source members to further superimpose a field on the deflecting field which focuses the beam so that, apart from the deflection of the beam, also a focusing in at least a direction transverse to the beam direction can be effected.

Moreover, it is preferred that the individual field source members together produce also field components within the opening which have a higher order than a quadrupole order. These fields of higher order can be used to compensate for specific aberration components of the beam which are produced elsewhere in the beam path. For example, an image field curvature can be manipulated by providing an octupole. A triadic astigmatism can be compensated for by a hexapole, and a spheric aberration can be compensated for by two hexapole fields which are successively disposed in the beam path.

Apart from the compensation of aberrations components already existing in the beam when the same enters the comb lens, such aberrations can also be deliberately produced by the comb lens such that a "supply" of aberrations results into a reduction of the aberrations in the subsequent beam path by aberrations produced therein.

According to the invention, such a particle-optical deflection arrangement is used in a lithography system for transferring a pattern defined on a mask on a particle-sensitive substrate by means of at last one beam of charged particles. Further, such a particle-optical deflection arrangement is used in a microscopy system for generating a particle-optical image of an object.

Moreover, it is provided for that a first and a second particle-optical deflection arrangement of the type described above are successively disposed in a beam path, wherein, in particular, a beam deflection caused by a first one of the two particle-optical deflection arrangements is compensated for by the second deflection arrangement so that the beam, after exiting from the second deflection arrangement, extends into the same direction as prior to entering the first deflection arrangement, however, offset in parallel as compared thereto.

Preferably, the beam path between the two deflection arrangements is a telescopic beam path, that is, the beams emanating from an object point extend there substantially in parallel and are substantially sharply imaged of an image point. A distance between the deflection arrangements can be changed without changing the imaging performed with the beam, except for a changed beam displacement.

According to a fourth aspect, the invention relates to the influencing of a plurality of beams of charged particles by a beam changing arrangement, the beams being supplied to the beam changing arrangement such that they enter the beam changing arrangement offset from each other along a first direction oriented transversely to the direction of the radiation. In so doing, they enter a common spatial field region wherein an inhomogeneous electric or/and magnetic field prevails for influencing the beams such that a different effect is produced on each of the beams by the field. Within the scope of the present application, the beam changing arrangement provides a field which is dividable into one or more field regions. However, when the field is divided into several field regions, at least one component of the field exhibits a periodicity which corresponds to the number of field regions. When, in the presently described embodiment of the invention, several beams are guided through a single common field region, this single field region is to be understood as a field region wherein the field exhibits no field component which has a spatial periodicity corresponding to the number of the beams.

Preferably, the field in the common spatial region is a quadrupole field which has a defocusing effect on the beams. Preferably, the defocusing is effected in the first direction so that the beam changing arrangement acts on the row of beams like a diverging lens. This means that, when the plurality of beams enter the beam conversion apparatus, for example, in parallel to each other, they are divergent as far as their beam direction is concerned after having been subjected to the influence of the electric or/and magnetic field. As a result, a divergence in the individual beams themselves is, however, produced. Therefore, a further focusing device is preferably provided which produces a separate field for each beam to collimate respectively focus the same again in the first direction.

The beam changing arrangement can be configured as comb lens as described above.

However, it is also possible to provide the beam changing arrangement by another particle-optical apparatus, such as a conventional magnetic lens which produces a quadrupole field.

Here, again, according to the invention, the particle-optical arrangement is used in a lithography system or in a microscopy system.

BRIEF DESCRIPTION OF THE DRAWINGS

Embodiments of the invention are described below with reference to drawings, wherein FIG. 1 shows a spatially broken-away representation of a comb lens for use in embodiments of the invention, FIG. 2 is a schematic representation of field configurations illustrative of the comb lens shown in FIG. 1, FIG. 14 shows a lithography system according to an embodiment of the invention.

DETAILED DESCRIPTION OF EXEMPLARY EMBODIMENTS

Figure 3:
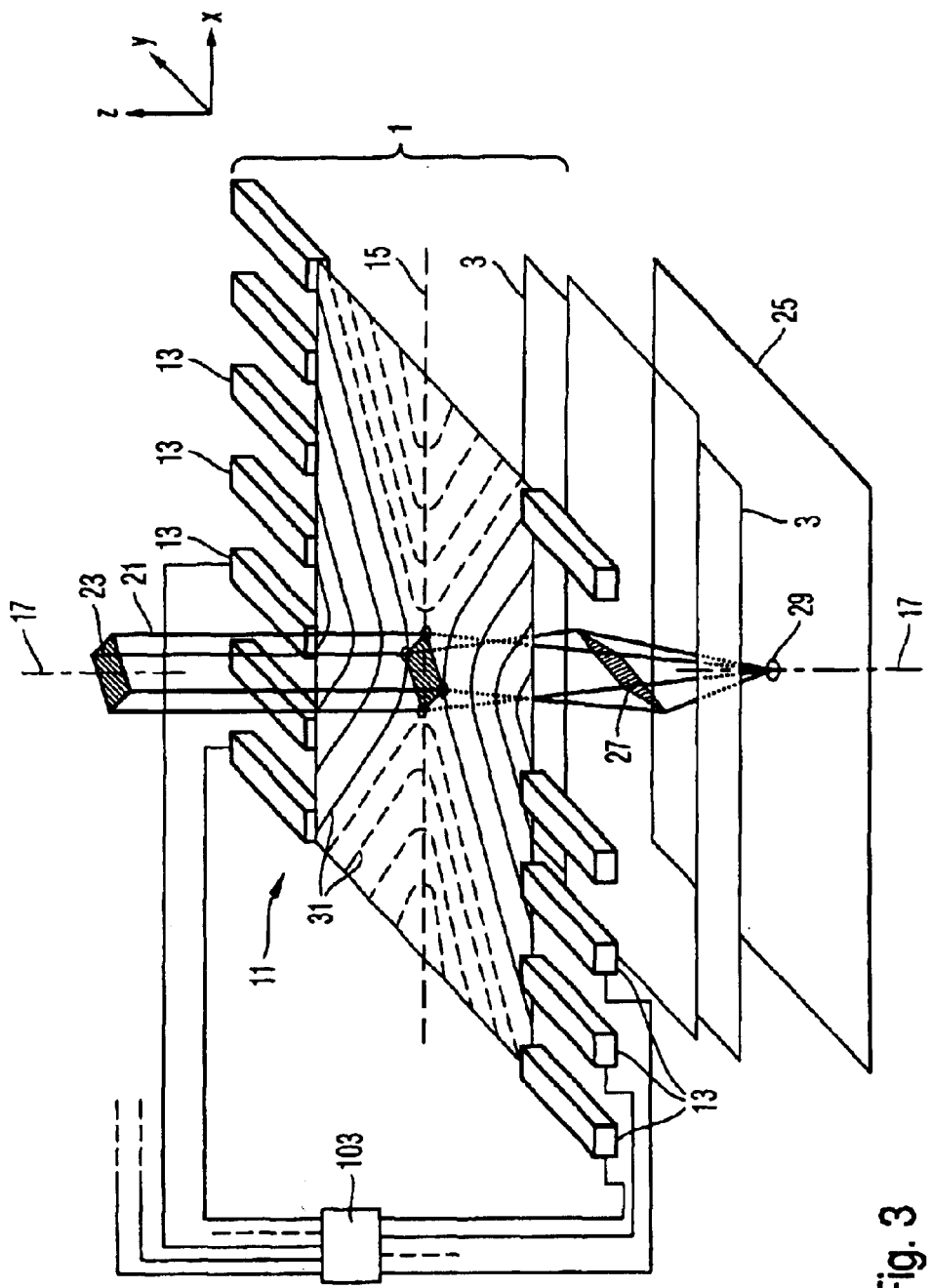
FIG. 3 is a spatially schematic broken-away representation of a path of a particle beam through a comb lens which has a focusing effect on the beam.

In the embodiments described below, components which are identical in function and structure are designated as far as possible by the same reference signs. Therefore, in order to understand the features of the individual components of a specific embodiment, one can also simply refer to the descriptions of other embodiments.

A beam changing arrangement 1 for use in connection with the present invention is schematically shown in FIG. 1 in broken-away perspective view.

It comprises three apertures above each other in z-direction, namely an electrode 3 at the bottom comprising an aperture 5 elongated in x-direction, an electrode 7 at the top comprising an aperture 9 likewise elongated in x-direction, as well as a comb lens 11 disposed between the two electrodes 3 and 7. The comb lens 11 comprises two rows of finger electrodes 13 which are disposed on both sides of a central axis 15 of the comb lens 11 extending in x-direction. The two rows of comb electrodes 13 thus delimit in y-direction a space above and below the apertures 5 and 9 in electrodes 3 and 7, respectively, such that this space can likewise be considered as an aperture of the comb lens 11.

Electric potentials are supplied to the two electrodes 3 and 7 as well as to the finger electrodes 13 by a controller, not shown in FIG. 1, so that adjustable electric fields can be produced between the electrodes 3, 7 and 13. These fields act on a beam of electrically charged particles which is oriented transversely to the xy-plane and traverses the apertures of the electrodes 3, 7 and comb lens 11. If an electric potential is applied to the electrodes 3 or 7 which is different from the potential of the beam of charged particles in the plane of the electrodes 3, 7, the effect of the electrodes 3 and 7 respectively produced on the beam is that of a cylinder lens. A configuration of the electric field lines as it is produced by such an electrode 3, 7 is schematically shown in FIG. 2a.

A potential pattern can be applied to the finger electrodes 13 of the comb lens 11 such that an electric quadrupole field is generated in the aperture of the comb lens 11. A configuration of field lines of such a quadrupole field is schematically shown in FIG. 2b, the field having an axis of symmetry 17 which extends in z-direction and intersects the longitudinal axis 15 of the comb lens 11.

A beam of electrically negatively charged particles entering this quadrupole field is focused in x-direction and defocused in y-direction.

Thus, when a beam enters the beam changing arrangement 1 along the axis of symmetry 17 of the quadrupole field, it is subjected as a whole to the effects of the cylinder lens fields provided by the electrodes 3 and 7 according to FIG. 2a as well as the quadrupole field provided by the comb lens 11 according to FIG. 2b. The beam is thus subjected to a superposition of the field configurations shown in FIGS. 2a and 2b. When the strengths of the cylinder lens fields and the quadrupole field are appropriately adjusted to each other, the effect produced on the beam is the same as that produced by a round lens field, the field lines of which are schematically shown in FIG. 2c.

It is thus possible to focus a beam of charged particles by means of the beam changing arrangement 1 if an appropriate potential is applied to the electrodes 3, 7 and 13.

This is again shown in spatial view in FIG. 3: A beam 21 of charged particles of quadratic cross-section 23 enters a beam changing arrangement 1 along an axis of symmetry 17 an in z-direction. The beam changing arrangement comprises a comb lens 11 with two rows of finger electrodes 13 and an electrode 3 therebelow. Below the electrode 3, there is disposed an object plane 25 in which the beam 21 is to be focused.

A controller 103 applies such a potential pattern to the finger electrode 13 that an electric quadrupole field is generated in the opening between the rows of finger electrodes 13, the configuration of which is intimated in FIG. 3 by electric potential lines 31. The quadrupole field focuses the beam 21 in x-direction and defocuses the same in y-direction. Accordingly, after having passed through the comb lens 11, the beam assumes in the plane of the electrode 3 the cross-sectional shape of a rhombus 27 elongated in y-direction. The electrode 3, however, has the effect of a cylinder lens on the beam 21 which focuses the beam 21 in y-direction so that it is eventually focused in the object plane 25 on a small spot 29.

In FIG. 1, two electrodes 3 and 7 are respectively provided for generating the cylinder lens field whereas, in FIG. 3, merely one electrode 3 is provided for generating the cylinder lens field. However, it is also possible to provide the cylinder lens field by the comb electrodes 13 as such in that the mean potential thereof is set to a value which differs from the potential of the beam 21 in the plane of the comb electrode. Accordingly, on the average, the finger electrodes 13 provide the cylinder lens field, and the respective quadrupole field is provided by position-dependent changes of the potential of the finger electrodes 13.

Figure 4:
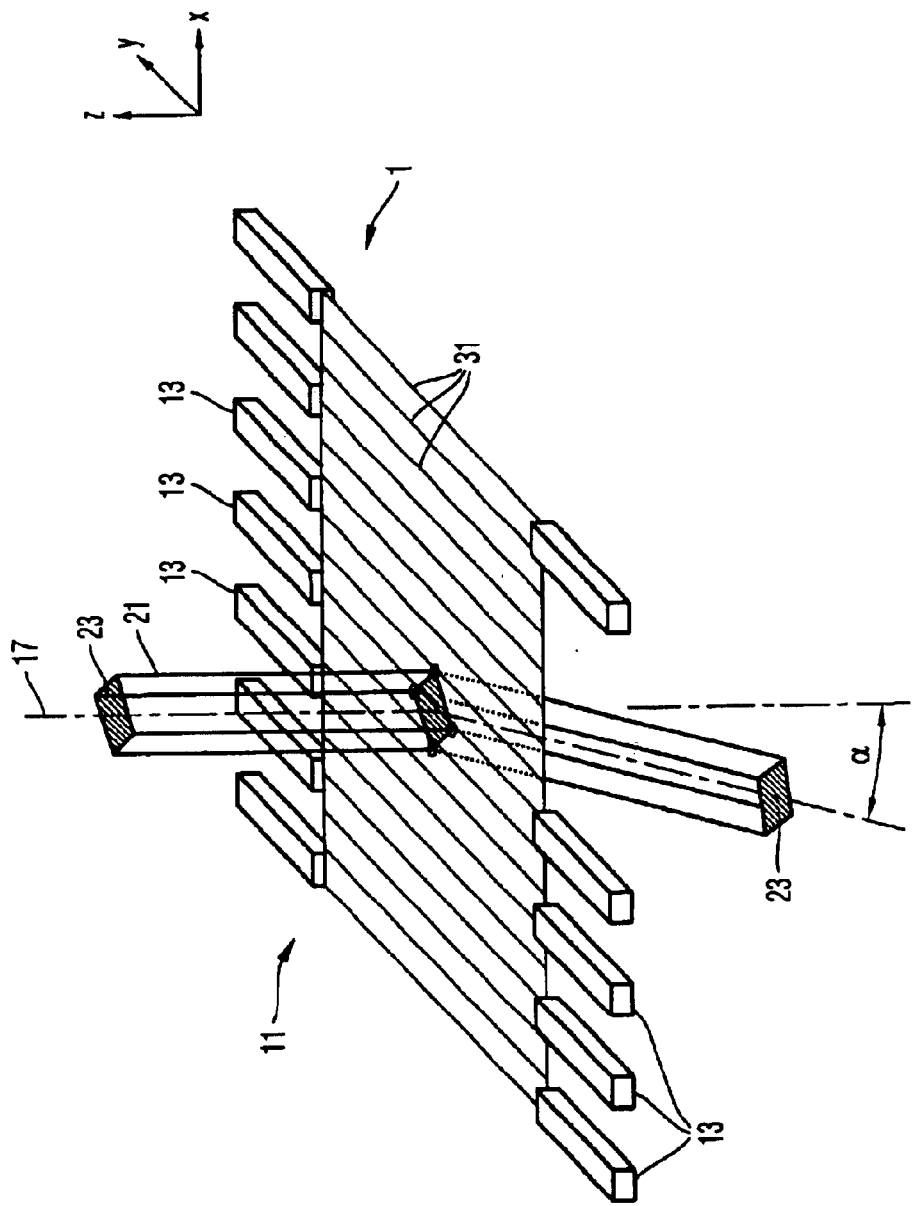
FIG. 4 is a schematic spatially broken-away representation of a path of a particle beam through a comb lens which has a deflecting effect on the beam.

FIG. 4 shows an operating mode of a comb lens 11 which differs from the operating mode shown in FIG. 3 for focusing a beam of charged particles. In FIG. 4, potentials are applied to the finger electrodes 13 by a controller, not shown in FIG. 4, such that a substantially homogenous electric field oriented in x-direction is produced in an opening between the two rows of finger electrodes 13, the potential lines 31 of which are schematically indicated in FIG. 4. A beam 21 of charged particles of quadratic cross-section entering the comb lens 11 along a beam axis 17 oriented in z-direction is deflected in x-direction at an angle α by the substantially homogeneous electric field formed in the opening between the two rows of finger electrodes 13, the cross-section 23 of the beam remaining substantially unchanged.

As a result, it is possible to use the comb lens 11 as beam deflector. In particular, the field which deflects the beam 21 can be provided in x-direction locally in the environment of the beam 21 in the opening between the two rows of finger electrodes 13, i.e., the electric field need not extend over the entire length of the comb lens 11 in x-direction.

Moreover, it is possible to combine the operating modes of FIGS. 3 and 4 in that potentials are applied to the finger electrodes 13 such that a superposition of the quadrupole field according to FIG. 3 with the homogeneous field according to FIG. 4 is provided in the opening between the electrode rows. An accordingly controlled comb lens then has the effect of a focusing beam deflector.

In the above-described FIGS. 1 to 4, the finger electrodes 13 each act as source members for the electric field provided by the comb lens 11 for generating an effect on the particle beam 21.

Figure 5:
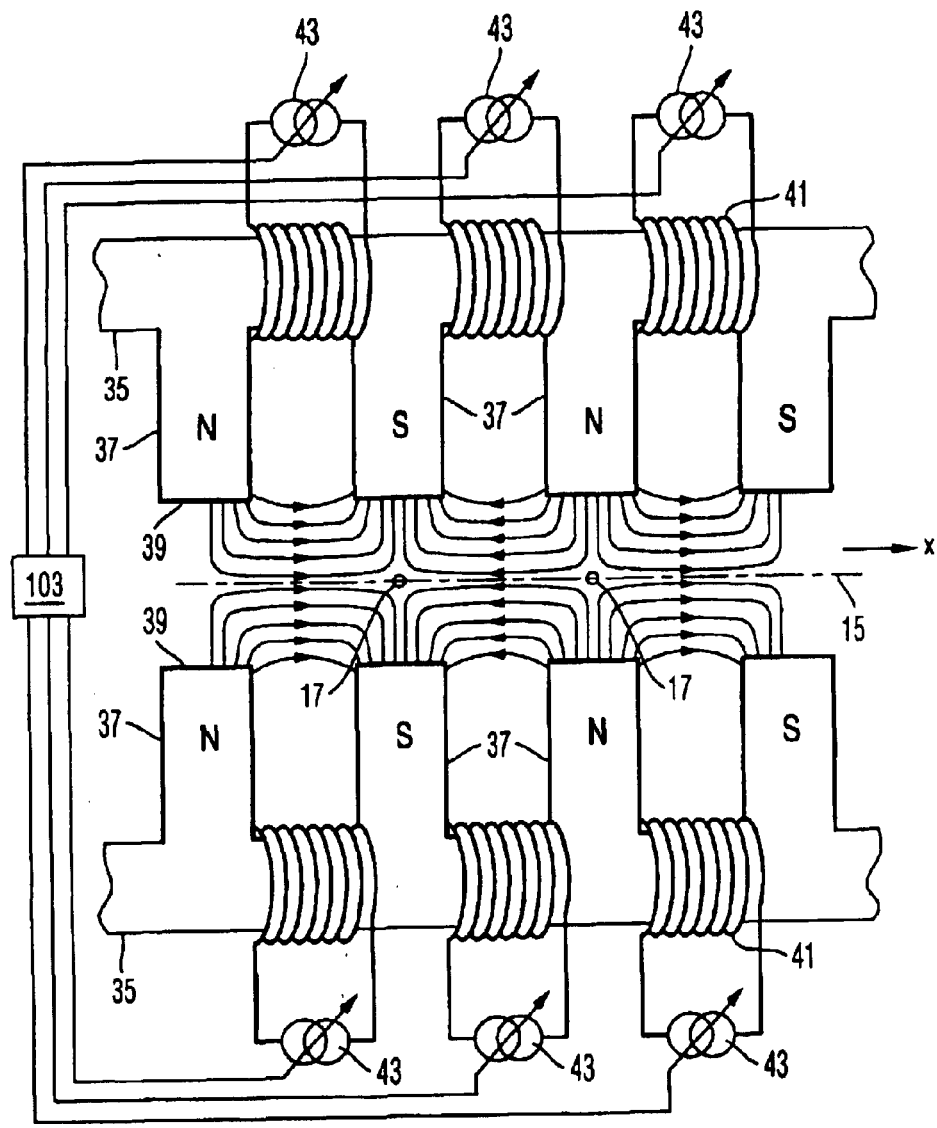
FIG. 5 is a schematic representation of a comb lens producing magnetic fields in the opening thereof.

Alternatively, it is, however, also possible to provide magnetic fields in an opening of a comb lens for generating an effect on the particle beam. A realization of such a comb lens is schematically shown in FIG. 5. The comb lens 11 shown there comprises two material rods 35 extending on both sides of a central axis 15 in x-direction, a row of material fingers 37 projecting therefrom in the direction of the central axis 15. The material fingers 37 are disposed spaced apart from each other, and each one of said material fingers comprises a front face 39 disposed towards the central axis 15. Between two adjacent material fingers 37, a winding 41 of electrically conductive wire is wound around the material rods 35. In order to supply electric current to each one of the windings, a current source 43 is provided for each winding which is controllable by a controller, not shown in FIG. 5, in order to apply to each winding 41 a current of adjustable current strength. The current conductor windings 41 then produce magnetic fields which, among others, are carried by the material rod 35 and the material fingers 37. In FIG. 5, a current pattern is applied to the windings 41 such that adjacent windings 41 each produce magnetic fields of opposed orientation. As a result, a magnetic field configuration is produced in an opening of the comb lens 11 as schematically shown in FIG. 5 by the field lines 45. The field configuration is approximately that of a plurality of quadrupole fields disposed along the central axis 15 adjacent to each other with axes of symmetry 17 spaced apart from each other.

The material providing the material rods 35 and material fingers 37 is preferably a material of high magnetic permeability, such as ferrite material, for example. In order to fabricate the magnetic field source members in miniaturized form, a technology can be applied as it is employed for the fabrication of write-read heads for hard disks for data storage.

The comb lens shown in FIG. 5 constitutes an independent aspect of the invention according to the present application so that a correspondingly configured beam changing arrangement comprises as features thereof merely a support carrying the magnetic flux on which coils are provided spaced apart in longitudinal direction of the support body, with field source members projecting therebetween. Two support bodies can be provided spaced apart from each other in parallel, the projecting source members facing each other.

It is also possible to combine magnetic and electric comb lenses in one structural arrangement, in that, for example, the material fingers 37 are metallized to provide the same as electrodes to which adjustable electric potentials can be applied. It is then possible to superimpose electric and magnetic fields in the opening between the two rows of fingers to act on beams of charged particles.

Figure 6:
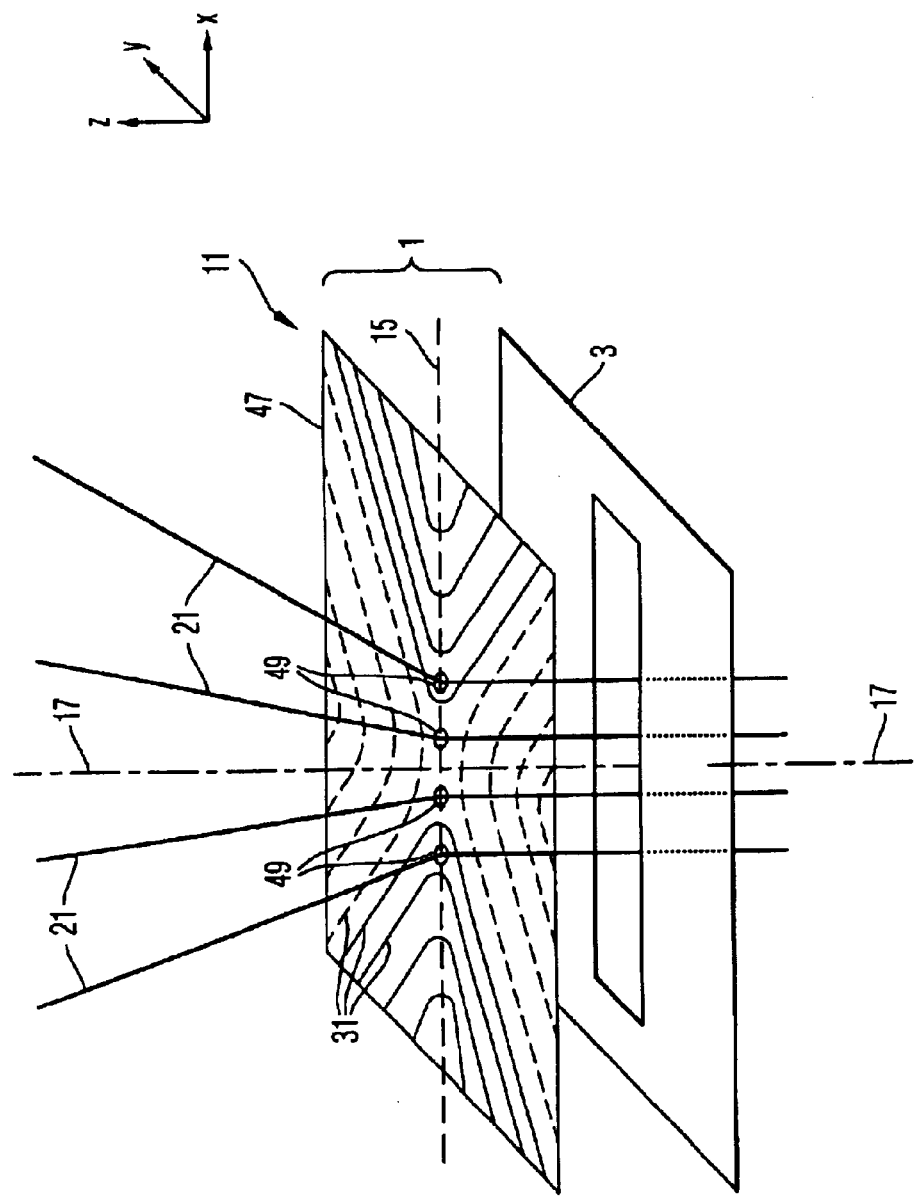
FIG. 6 is a schematic representation illustrating the function of the comb lens as diverging lens.

FIG. 6 shows a further operating mode of a beam changing arrangement 1 comprising a comb lens 11 and an electrode 3. In order to simplify the representation, finger electrodes of the comb lens 11 are not shown in FIG. 6, but merely an electric field produced by these finger electrodes is shown by the equi-potential lines 31 thereof. The electric field is a quadrupole field with an axis of symmetry 17 extending in z-direction. In contrast to FIG. 3, it is not a single beam which enters this electric field along the axis of symmetry 17. Rather, four beams enter the field, each of which extends in the xz-plane such that their distance in x-direction decreases towards the plane of the finger electrodes. The beams traverse the plane 47 at points 49 which are disposed on the central axis 15 and are disposed there spaced apart from each other.

As the beams 21 do not extend along the axis of symmetry 17 of the quadrupole field, they are subjected to a deflecting field, the strength of which increases with increasing distance from the axis of symmetry 17. Accordingly, the two beams 21 of the row of beams which are disposed outwards in x-direction are deflected stronger than the two middle beams 21 of the row. The position-dependency and the strength of the electric field and the points 41 at which the beams 21 traverse the plane 47 are adjusted to each other such that the beams which are convergent above the plane 47 extend parallel to each other below the plane 47. The comb lens 11 has thus the effect of a diverging lens on the beams 21.

However, it is also possible to supply the individual beams in parallel to the comb lens which then exit from the same divergent from each other.

Figure 7:
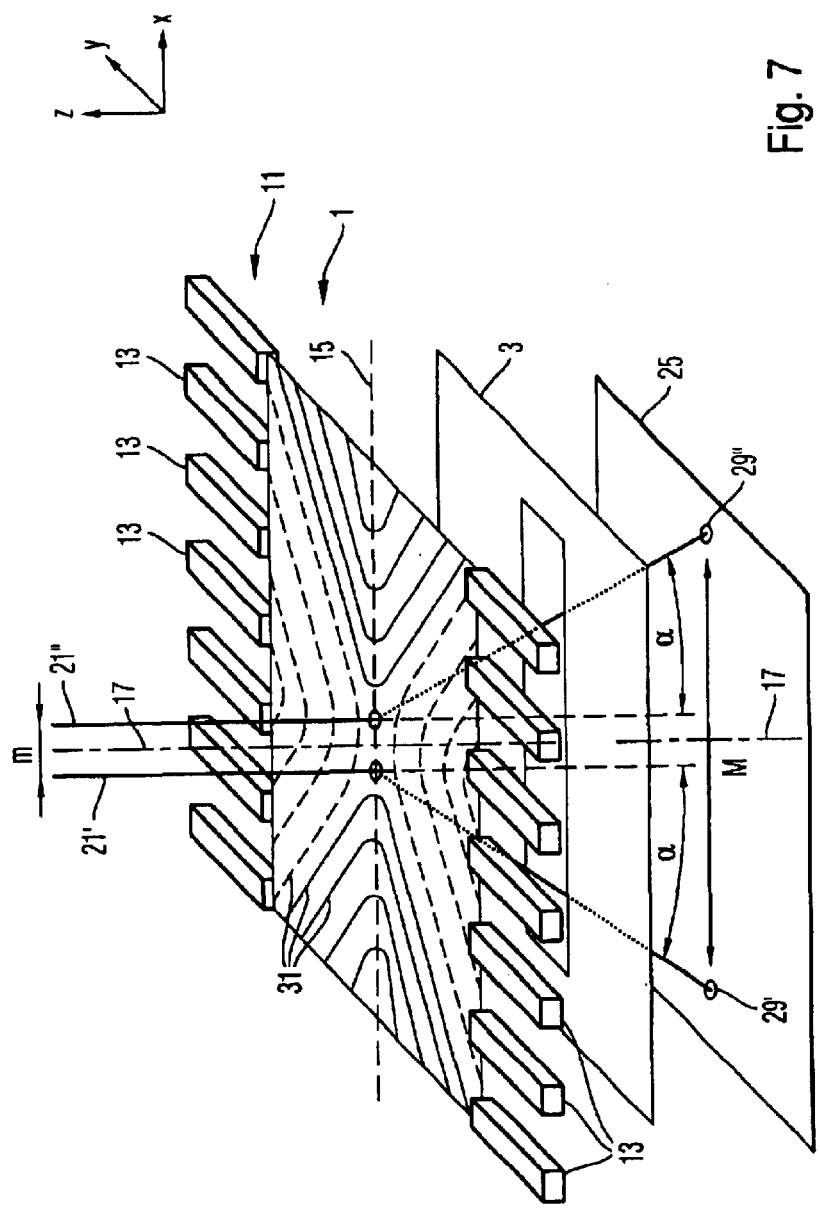
FIG. 7 is a schematic representation regarding the function of the comb lens in a variant of the operating mode shown in FIG. 6.

FIG. 7 shows a variant to FIG. 6. Here, the electrode 3 and the comb lens 11 are again disposed above each other in z-direction. Electric potentials are applied to the finger electrodes 13 of the comb lens 11 such that a quadrupole-like electric field is produced in an opening of the comb lens 11 between the rows of finger electrodes 13, with equi-potential lines 31 of this field in xy-direction of the comb lens 11 being schematically shown in FIG. 7. In contrast to FIG. 6, it is not a plurality of beams 21 which are supplied to the thus formed beam changing arrangement 1. Rather, a single beam 21 is directed parallel to the z-axis such that it insects the central axis 15 of the comb lens 11 and is displaceable parallel along this central axis 15 by a distance m. In FIG. 7, reference number 21' indicates the displacement position of the beam furthest to the left, and reference number 21" indicates its displacement position furthest to the right. The beam 21' impinges in the xy-plane on the left besides an axis of symmetry 17 of the quadrupole-like field, which results into the beam being deflected at an angle α to the left so that it is focused to a spot 29' in an object plane 21. The beam 21" impinges on the right side of the axis of symmetry 17 in the xy-plane and accordingly deflected to the right at an angle α so that it is focused to a spot 29" in the object plane 25. A distance M between the two spots 29' and 29" is considerably larger than the distance m at which the beam 21 is displaced parallel prior to entering the arrangement 1. It is thus possible, by a slight displacement of the incident beam by the amount m, to scan a considerably larger region along a distance M on the object plane 25.

Figure 8:
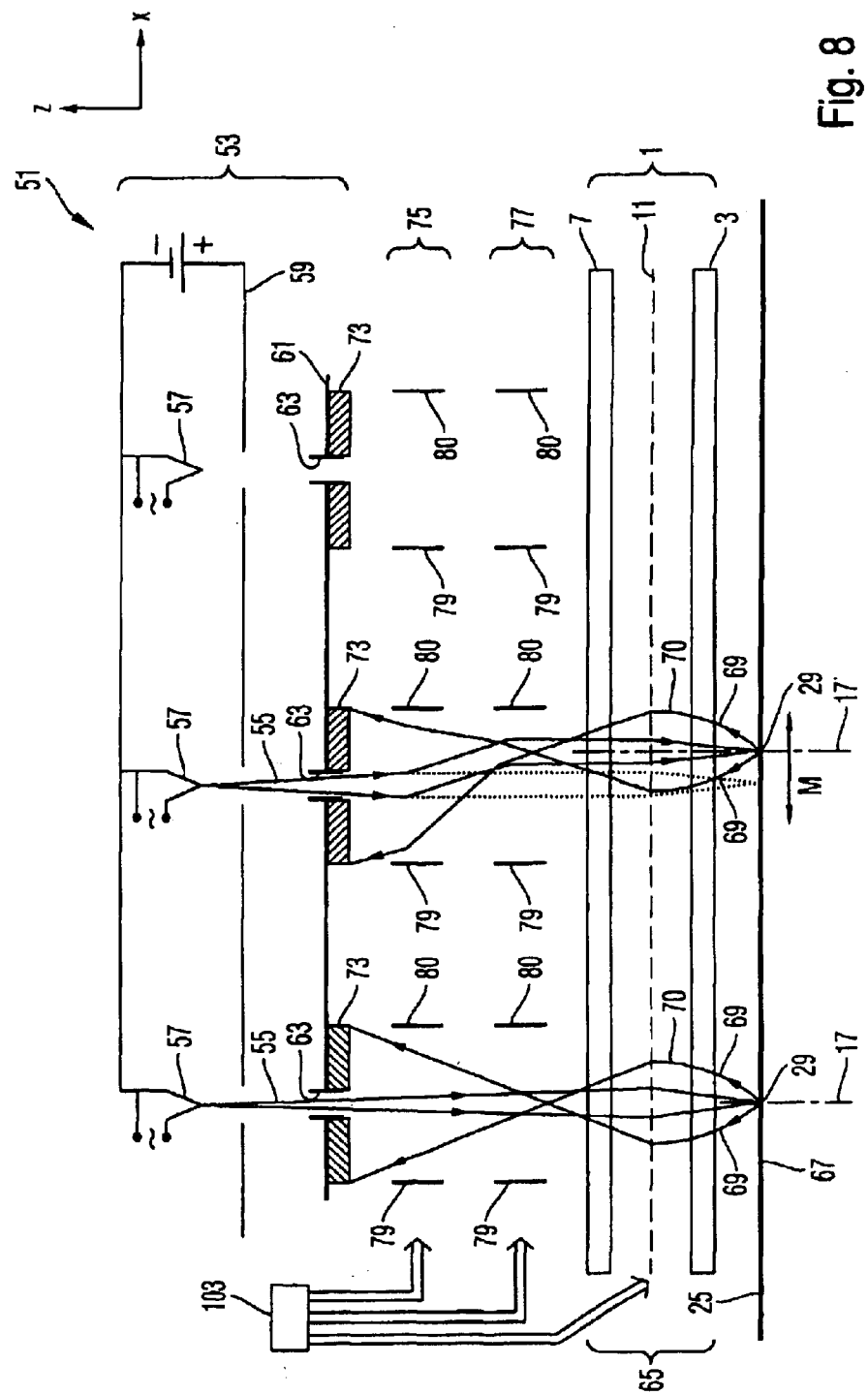
FIG. 8 is an electron microscopy apparatus according to an embodiment of the invention.

FIG. 8 schematically shows a scanning electron microscopy apparatus 51. It comprises a radiation source arrangement 53 for generating a plurality of primary electron beams 55 comprising a plurality of cathodes 57 for emitting electrons, an anode 59 for extracting the electrons from the cathodes 57 as well as an aperture stop 61 with a plurality of stop apertures 63 for shaping the plurality of beams 55. In FIG. 8, the arrangement 51 for the provision of three electron beams 55 is shown. However, it is also possible to correspondingly provide merely two or more than three beams.

The microscopy apparatus 51 further comprises an objective arrangement 65 for focusing the primary electron beams 55 in an object plane 25 in which an object to be examined, for example, a semiconductor wafer 67, is disposed. From the object 67 the primary electron beam 55 (probe beam) directed thereto extracts secondary electrons, the movement of which is shown by some exemplary trajectories 69. The secondary electrons are accelerated by a suitable electric field applied between the objective arrangement 65 and the object 67 and shaped to beams 70 which pass through the objective arrangement and impinge on detectors 73 disposed below the aperture stop 61.

Between the detectors 73 and the objective arrangement 65, there are successively disposed a first deflector arrangement 75 and a second deflector arrangement 77. The deflector arrangements 75 and 77 comprise for each primary electron beam 55 a pair of deflection electrodes 79 and 80 to which electric potentials are applied by a controller 103 to produce an electric field between an electrode pair 79, 80 for deflecting the primary electron beam 55. In the case of the beam 55 shown on the left-hand side of FIG. 8, no voltage is applied to the electrodes 79, 80 in both deflector arrangements 75 and 77 so that the deflector arrangements 75 and 77 are traversed straightly by the left primary electron beam 55.

In the case of the primary electron beam 55 shown in the middle of FIG. 8, an electric voltage is applied to the electrodes 79, 80 of the upper deflector arrangement 75 such that the primary electron beam 55 is first deflected at an angle to the right. An opposite voltage is applied to the electrodes 79, 80 of the lower deflector arrangement 77 such that the primary electron beam 55 is deflected at a corresponding angle to the left such that, after having passed through the deflector arrangement 77, it extends again parallel to the z-axis towards the objective arrangement 65. Accordingly, the two deflector arrangements 75, 77 serve to displace the primary electron beam 55 focused in the object plane 25 parallel in the object plane so that the object 67 can be scanned with the probe beam.

The objective arrangement 65 includes a single beam changing arrangement 1 as it has been described with reference to FIGS. 1 to 3 and comprises an upper electrode 7, a lower electrode 3 and a comb lens 11 disposed therebeween. The electrodes 3, 7 and the comb lens 11 each include an opening which is coherent in x-direction and is traversed by all primary electron beams 55 and secondary electron beams 70.

Finger electrodes 13, not individually shown in FIG. 8, of the comb lens 11 are supplied with electric potentials by the controller 103 such that a quadrupole-like field is formed for each primary electron beam 55, as it has been described with reference to FIG. 3. This quadrupole-like field provided for each primary electron beam has an axis of symmetry 17 which coincides with a main axis of the primary electron beam 55 when entering the objective arrangement 65. Accordingly, the quadrupole field together with the cylinder lens field provided by the electrodes 3 and 7 has a focusing effect on the beams as it illustrated in FIG. 3.

Now, the controller 103 displaces the voltage pattern applied to the finger electrodes of the objective system 65 in x-direction together with the control of the deflection electrodes 79, 80 of the deflector arrangements 75, 77 in order to ensure, independent of the magnitude of the beam displacement M produced by the deflector arrangements 75, 77, a substantially central impingement of the respective primary electron beam 55 in the quadrupole field of the comb electrode 11 allocated thereto, so that the focusing in the objective plane 25 as explained above with reference to FIG. 3 is substantially ensured.

Accordingly, with the microscopy apparatus 51 shown in FIG. 8 it is possible to scan an object simultaneously with a plurality of primary electron beams 55 and to detect for each one of the primary electron beams 55 a secondary electron signal allocated thereto by means of the detectors 73 respectively allocated thereto. As a result, an electron-microscopic image of the object can be obtained.

Figure 9:
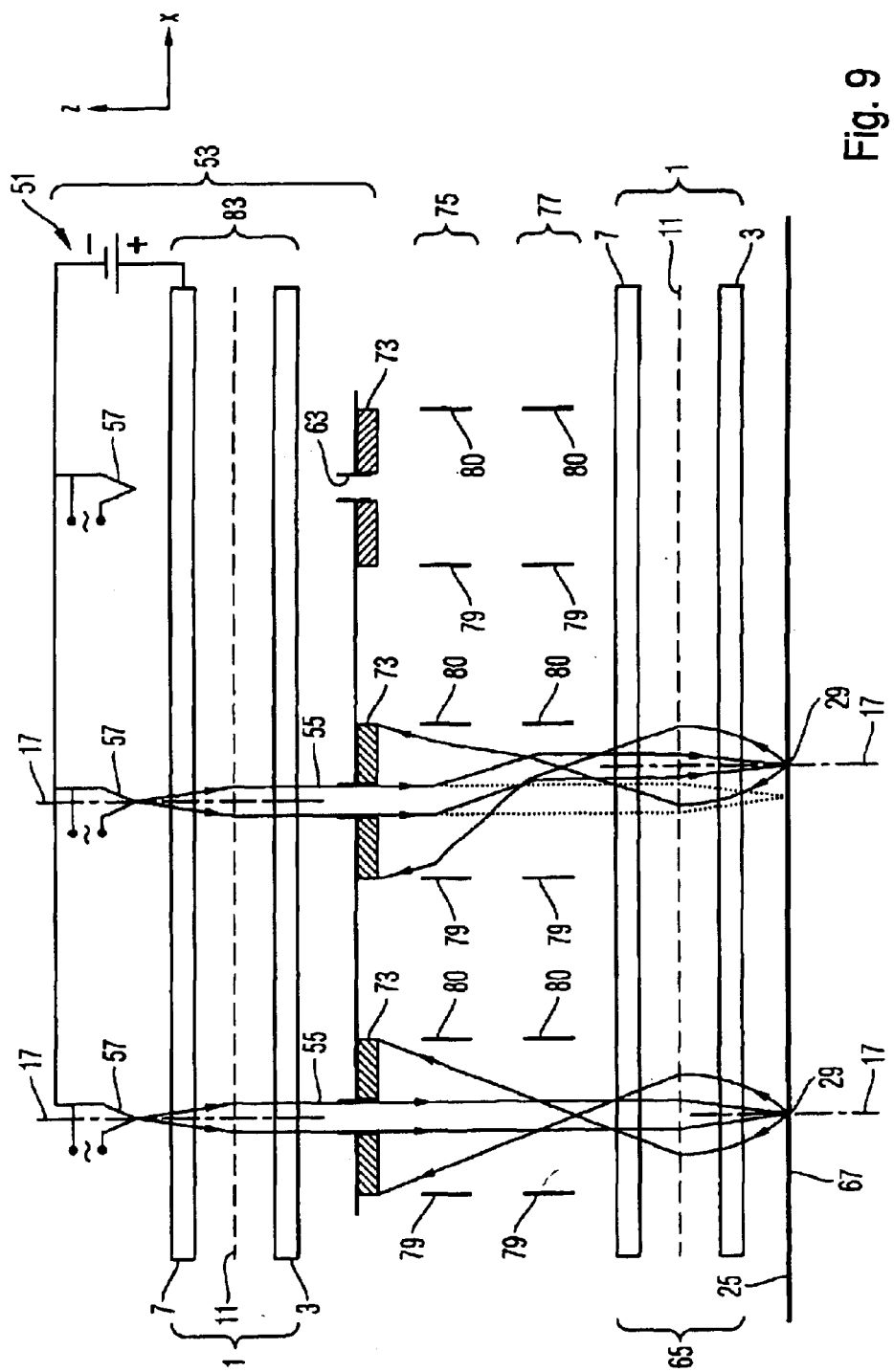
FIG. 9 is an electron microscopy apparatus according to a further embodiment of the invention.

A microscopy apparatus 51 shown schematically in FIG. 9 is in structure similar to the microscopy apparatus shown in FIG. 8. In contrast thereto, the microscopy apparatus 51 shown in FIG. 9, however, comprises a beam shaping arrangement 53 which respectively collimates primary electron beams 55 by means of a common collimating arrangement 83. The collimating arrangement 83 comprises again a beam changing arrangement 1 as explained with reference to FIGS. 1 and 3 which again is in structure similar to the beam changing arrangement of the objective arrangement 65. Accordingly, the collimating arrangement 83 comprises upper and lower electrodes 7, 3 and a comb electrode 11 disposed therebetween, each of which is formed with an opening extending in x-direction for all primary electron beams to commonly pass therethrough. The comb electrode 11 of the collimating arrangement 83 provides for each primary electron beam 55 a quadrupole-like electric field in respect of axes of symmetry 17, each of which is in alignment with the electron-emitting regions of the glow cathodes 57. The electrodes emitted divergently by the glow cathodes 57 are collimated by the combined effect of the electric cylinder lenses and quadrupole fields to form substantially parallel primary electron beams 55.

The use of the described beam changing arrangement 1 is also advantageous for the collimation of several beams, because, in contrast to a plurality of collimating lenses separately configured for each primary electron beam 55, it is possible for the individual primary electron beams 55 to be spaced apart from each other at a smaller distance. Moreover, an adjustment of the individual lens fields relative to the desired beam axes and beam sources, respectively, and to the glow cathodes 57 can be electrically performed. Mechanical adjustment steps for a plurality of separate collimating lenses is thus rendered superfluous.

Figure 10:
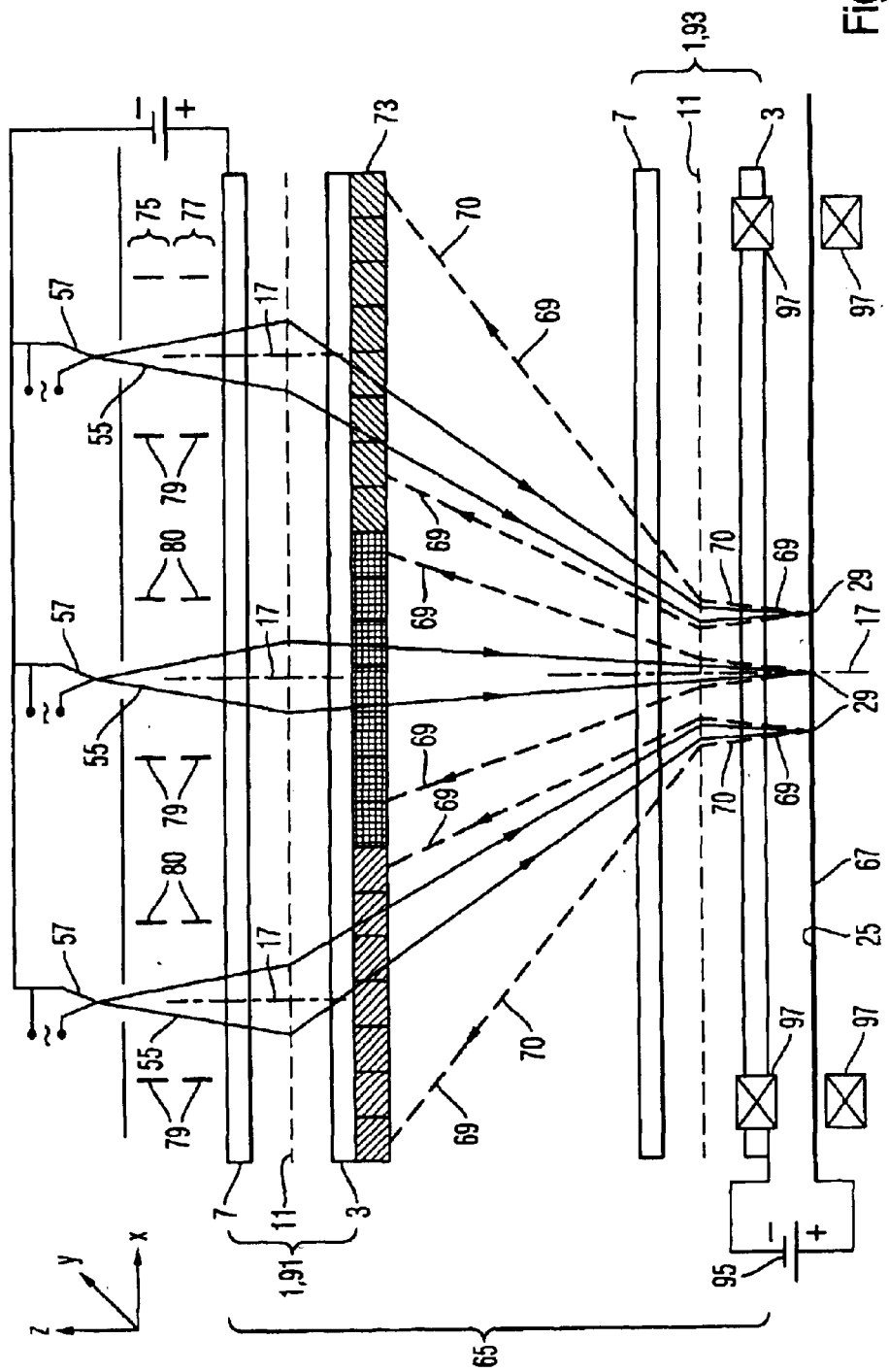
FIG. 10 is an electron microscopy apparatus according to a still further embodiment of the invention.

FIG. 10 schematically shows a further microscopy arrangement 51. In order to generate a plurality of primary electron beams 55, it comprises again a beam shaping arrangement 53 with a plurality of electron sources 57 and an aperture stop 59 for shaping the plurality of beams 55. An objective arrangement 65 for focusing the primary electron beams 55 in an object plane 25 in which an object 67 to be examined is disposed comprises two beam changing arrangements 1 as they have been described above with reference to FIGS. 1 to 3. These are a beam changing arrangement 93 disposed close to the object and a beam changing arrangement 91 disposed remote from the object between the beam changing arrangement 93 close to the object and the beam source arrangement 53. Each of the beam changing arrangements 91, 93 comprises an upper electrode 7, a lower electrode 3 and a comb lens 11 disposed therebetween, the finger electrodes of the comb lens 11 being not shown in detail in FIG. 10.

Electric potentials are applied to the finger electrodes of the comb lens 11 of the beam changing arrangement 91 remote from the object by means of a controller, not shown in FIG. 10, such that for each of the primary electron beams 55 a quadrupole field with an axis of symmetry 17 is provided which is substantially in alignment with the respective beam source 57. Accordingly, the comb lens 11 together with the cylinder lens fields provided by the electrodes 3, 7 has a focusing effect on the primary electron beams 55 divergently emerging from the openings of the stop 59.

Moreover, the finger electrodes of the comb lens 11 of the beam changing arrangement 91 remote from the object are controlled such that an electric deflection field, as it has already been explained above with reference to FIG. 4, is respectively superimposed on the individual quadrupole fields with their axes of symmetry 17. These deflection fields are separately adjusted for each one of the beams 55 such that the beam shown on the left-hand side of FIG. 10 is deflected to the right, the central beam of FIG. 10 is not deflected and the beam shown on the right-hand side of FIG. 10 is deflected to the left so that the primary electron beams 55, after having passed through the beam changing arrangement 91, are focused as such and converge towards each other in the xz-plane.

Electric potentials are applied by the controller to the finger electrodes of the comb electrode 11 of the beam changing arrangement 93 close to the object such that a quadrupole-like electric field is provided in the opening of the comb electrode for the individual primary electron beams 55 as already explained above with reference to FIG. 6. The quadrupole-like field is substantially symmetric with respect to an axis of symmetry 17. Prior to entering the beam changing arrangement 93 close to the object, the primary electron beam 55 shown in the middle of FIG. 10 is substantially in alignment with the axis of symmetry 17 of the quadrupole-like field provided by the comb electrode 11 thereof. The left and the right primary electron beams 55 impinge to the left and the right, respectively, of the axis of symmetry 17 on the xy-plane of the comb electrode 11 of the lower beam changing arrangement 93 and, similar to the outer beams 21 of FIG. 6, are deflected by the quadrupole-like field such that, after having passed therethrough, all primary electron beams 55 are again oriented substantially parallel to the z-axis and focused to the object plane 25 at positions 29.

Accordingly, with the microscopy apparatus 51 shown in FIG. 10, it is possible to direct a plurality of primary electron beams 55 extremely closely adjacent to each other to the object 67 under examination. A distance between the primary electron beams 55 at the object 67 is thus not limited by the structural space required for the individual beam sources 57 or by components required for shaping the primary electron beams 55.

The quadrupole field provided in the common field region has a slightly defocusing effect in x-direction on each individual beam. However, this can be compensated for in that an accordingly oriented quadrupole field is produced by the focusing device 91 such that it is compensated for the defocusing of the beam changing arrangement 93.

The electron microscopy apparatus 51 shown in FIG. 10 also enables a displacement in x-direction of the positions 29 to which the primary electron beams 55 are focused in the object plane 29. To this end, first, upper and lower deflecting arrangements 75 and 77 are provided between the stop 59 and the beam changing arrangement 91 remote from the object. They are controllable by the controller of the mircoscopy apparatus 51 in order to displace the primary electron beams 55 in parallel with respect to the axes of symmetry 17 of the quadrupole fields provided by the beam changing arrangement 91 remote from the object. This results into an adjustable deflection angle of the primary electron beams in similar way as described with reference to FIG. 7.

Moreover, the strengths of the deflecting fields (see FIG. 4) provided by the beam changing arrangement 91 remote from the object are variable so that here, too, the deflection angles of the beam changing arrangement 91 remote from the object are adjustable for the individual primary electron beams 55.

The deflection arrangements 75 and 77, on the one hand, and the beam changing arrangement 91, on the other hand, thus provide, within practical limits, two independent possibilities to change the direction of the beams 55 between the beam changing arrangement 91 remote from the object and the beam changing arrangement 93 close to the object.

Accordingly, it is possible to displace the positions 29 at which the primary electron beams 55 traverse the xy-plane of the comb lens 11 of the beam changing arrangement 93 close to the object as a whole in x-direction. In correspondence with the displacement of theses positions, the potential pattern of the electric potentials applied to the finger electrodes of the comb lens 11 of the beam changing arrangement 93 close to the object is then carried along so that the axis of symmetry 17 of the beam changing arrangement 93 close to the object is then likewise carried along and the primary electron beams 55 always exit substantially parallel to each other from the beam changing arrangement 93 close to the object and are again focused to the object plane 25, however, displaced in respect of the positions 29 shown in FIG. 10.

FIG. 10 likewise shows a voltage source 95 for providing an electric extraction field for secondary electrons 96 between the beam changing arrangement 93 close to the object and the object 67 to be examined. Furthermore, FIG. 10 shows an arrangement of Helmholtz coils 97 which produce a magnetic field penetrating the object 67 to be examined in order for the secondary electrons emanating from the object 67 to be focused and for the same to enter the beam changing arrangement 93 close to the object as substantially separated secondary electron beams 70. The beam changing arrangement 93 close to the object acts on the secondary electron beams 70, in similar way as it acts on the primary electron beam 55, like a diverging lens, so that the secondary electron beams 70, after having traversed the beam changing arrangement close to the object 93, extend divergently in the xz-plane.

Below the electrode 3 of the beam changing arrangement 91 remote from the object, there is disposed a position-sensitive electron detector 73 which, however, comprises an opening for the primary electron beams 55 to pass through which is in alignment with the opening elongated in x-direction of the electrode 3. The secondary electron beams 70 are larger in cross-section than the primary electron beams 55 so that a considerable intensity of the secondary electron beams 70 impinges on the same on both sides of the opening provided in the detector 93.

Figure 11:
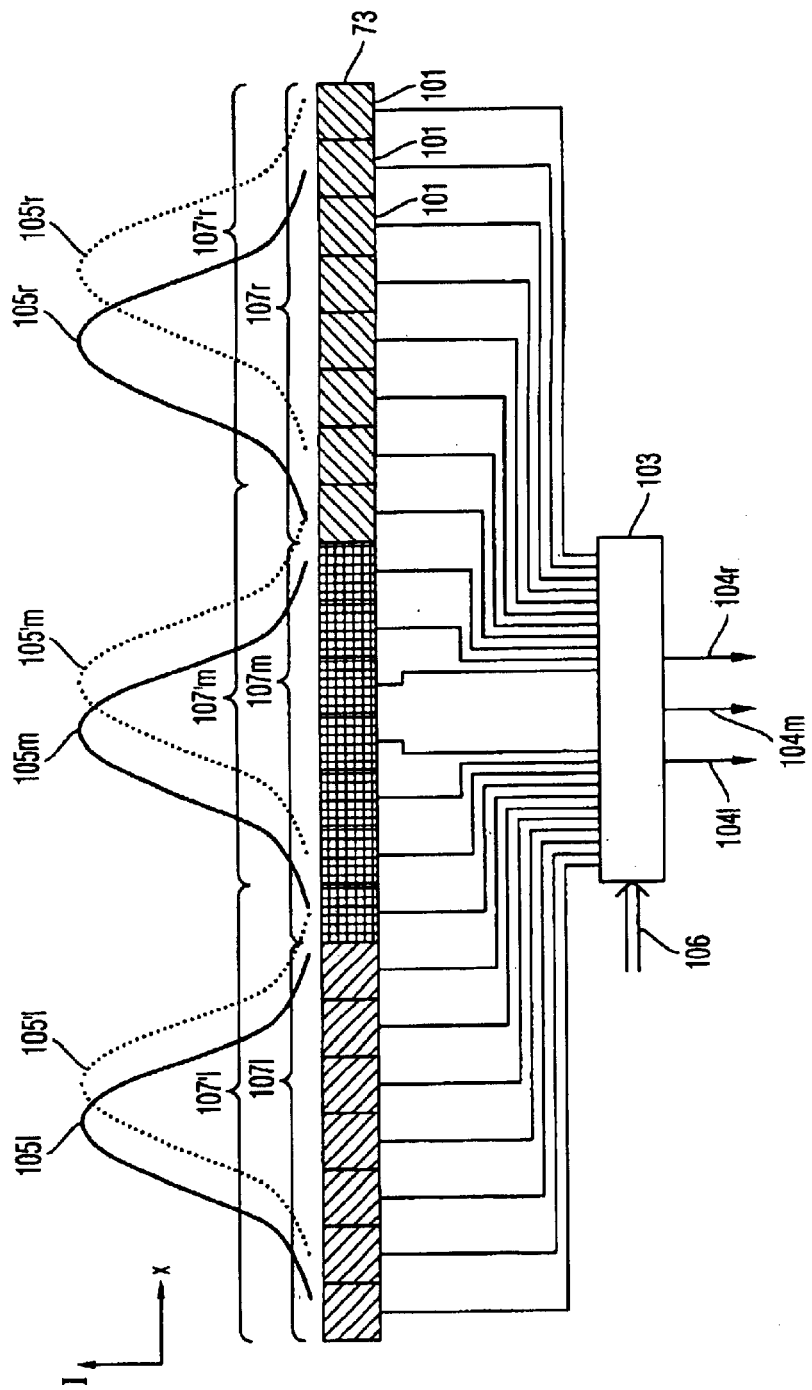
FIG. 11 is illustrative of the function of a detector in the electron microscopy apparatus according to FIG. 10.

FIG. 11 schematically shows in detail the position-sensitive beam detector 73 of the electron microscopy apparatus 51 of FIG. 10. The position-sensitive detector comprises, a plurality of electron-sensitive surface elements 101. An electron intensity integrally detected by each one of the surface elements 101 is read out by a controller 103. The row of surface elements 101 extends in x-direction. In FIG. 11, the intensities I of the secondary electrons impinging on the detector 73 are schematically shown relative to the x-direction as curves 105*l*, 105*m* and 105*r*. Here, the curve 105*l* is representative of the secondary electron intensities caused by the primary electron beam shown on the left-hand side of FIG. 10, the curve 105*m* is representative of the secondary electron intensities caused by the primary electron beam 55 shown in the middle of FIG. 10 and the curve 105*r* is representative of the primary electron intensities caused by the right primary electron beam 55 of FIG. 10. It is evident from the configurations of the curves 105*l*, 105*m* and 105*r* that the secondary electrons which are allocatable to the different primary electron beams 55 impinge on substantially separable spatial regions of the electron detector 73.

Accordingly, the controller 103 combines the surface elements 101 to separate groups 107*l*, 107*m* and 107*r*, respectively, each one of the groups 107*l*, 107*m* and 107*r* being clearly allocated to one of the primary electron beams 55. The secondary electron intensities detected by the individual surface elements 101 of each group 107*l*, 107*m*, 107*r* are added by the controller 103 for determining a secondary electron intensity produced by each one of the primary electron beam.

These secondary electron intensities are then supplied by the controller via lines 104*l*, 104*m*, 104, for example, to a central controller, such as a computer, which controls the entire apparatus. As a result, even in case of a great number of primary electron beams, a data rate to be transmitted to the central control is relatively small. The central control can configure the controller 103 via a control line 105 and thus determine those groups of detector members 101 whose intensity is to be combined. This configuration will then be effected dependent upon a displacement of the primary electron beams. In this respect, it is, in particular, also possible to combine groups of detector members 101 which comprise less detector members 101 than depicted in FIG. 11 for the groups 107*l*, 107*m*, 107*r*. For example, it is possible to provide for each secondary electron beam 105 two, three or more groups whose intensities are combined. A separate line 104 can then be provided for each group in order to transmit the combined intensity values thereof to a central control, where sums of individual groups can then in turn be formed.

It is evident from FIG. 10 that, together with a displacement of the primary electron beams 55 and the positions 29 where the primary electron beams 55 are focused in the object plane 25, respectively, the regions where the secondary electron beams 77 impinge on the detector 73 are likewise displaced in x-direction.

In FIG. 11, secondary electron intensities as they are caused by the primary electron beams 55 as they impinge on the detector 73 after a displacement of the positions 29 in x-direction are shown as curves 105'l, 105'm, and 105'r. They are displaced in x-direction with respect to the curves 105l, 105m and 105r. In this situation, the controller 103 changes the combination of the surface elements 101 to groups 107'l, 107'm and 107'r, respectively, such that these groups are again representative of regions on the detector 73 which are substantially separate from each other and allocated to the individual primary electron beams 55. Then, the intensities detected by the surface elements 101 of the groups 107'l, 107'm and 107'r are added to secondary electron intensities which are then respectively allocated to one of the primary electron beams 55. The controller 103 changes the combination of the surface elements 101 of the detector 73 dependent upon the displacement of the primary electron beams 55 in the object plane 25.

Instead of the separate detectors provided in the microscopy apparatuses shown in FIGS. 8 and 9, it is also possible to use one or more position-sensitive detectors therein. In this respect, it is also possible for the controller to change the combination of detector members to groups if this is necessary on account of a displacement of the secondary electron intensities.

Figure 12:
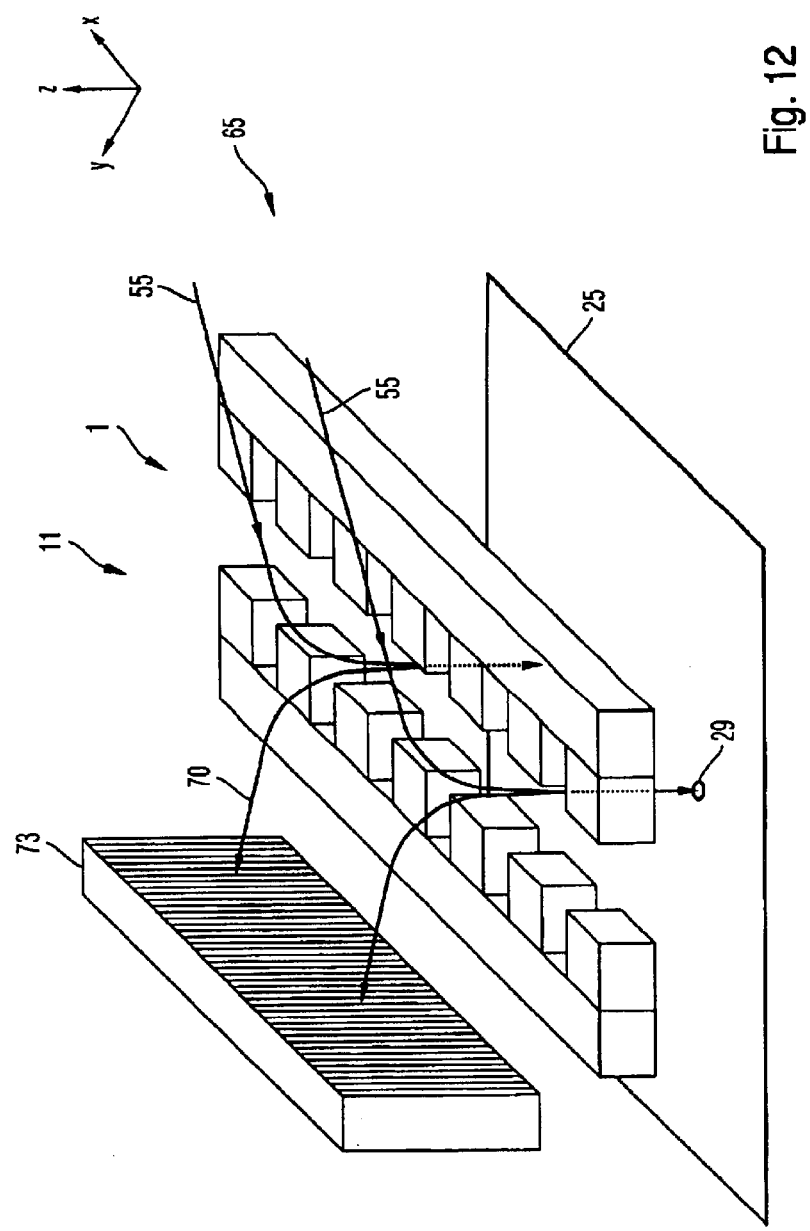
FIG. 12 shows a detail of a variant of the electron microscopy apparatus shown in FIG. 10.

FIG. 12 shows a variant of an objective arrangement 65 of a microscopy apparatus as it has been described above, for example, with reference to FIGS. 8, 9 and 10. The apparatus 65 again serves to focus primary electron beams 55 at positions 29 in the object plane 25.

However, the objective arrangement 65 comprises a beam changing arrangement 1 with a comb lens 11 which provides magnetic fields as they have been described above with reference to FIG. 5. While the microscopy apparatuses shown in FIGS. 8, 9 and 10 comprise beam guidances both for primary electrons and secondary electrons such that the plurality of beams extend in x-direction offset from each other but in a common xz-plane, the magnetic field provided by the comb lens 11 of FIG. 12 causes the beams to be deflected out of the xz-plane. Due to the opposed directions of movement of the primary electron beams 55 and the secondary electron beams 70, this deflection out of the xz-plane is also opposed for the primary electron beams 55 and the secondary electron beams 70.

As a result, it is possible to separate the beams of primary electrons and secondary electrons 55, 70 from each other, and it is not necessary to provide the electron detector 73 such that it is traversed by the primary electron beams as such. The recesses to be provided to this end in the detectors 73 in the microscopy apparatuses shown in FIGS. 8, 9 and 10 result into a loss in the detected secondary electron intensity. This is eliminated in the embodiment shown in FIG. 12 which likewise employs a position-sensitive secondary electron detector 73. Depending on the displacement of the primary electron beams 55 in x-direction, this detector can also be combined to regions and groups, respectively, in different ways as it has been described above with reference to FIG. 11.

As an alternative to the embodiment described with reference to FIG. 12, it is likewise possible, in order to separate the primary electron beam from the secondary electron beam, to omit the magnetically operating comb lens and/or to provide a substantially homogenous magnetic field instead, the field lines of which are oriented approximately parallel to the row of positions 29 at which the primary electron beams are focused on the object pane 25.

Figure 13:
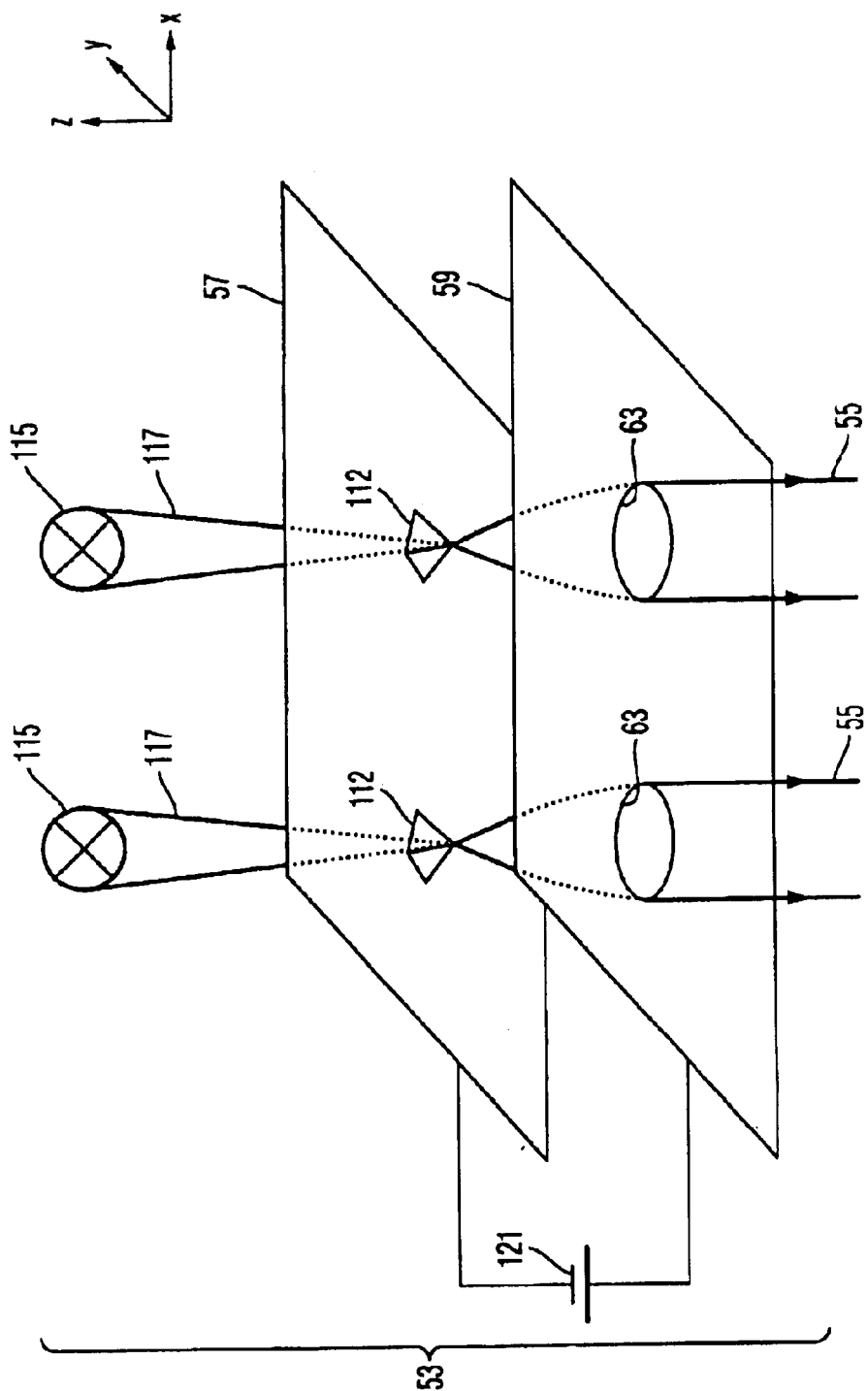
FIG. 13 shows a variant of a radiation source arrangement for use in the electron microscopy apparatus shown in FIGS. 8, 9 and 10.

FIG. 13 schematically illustrates a variant of the beam source arrangement of the microscopy apparatuses described with reference to FIGS. 8, 9 and 10. The radiation source arrangement 53 shown in FIG. 13 produces two primary electron beams 55, but it is expandable to a lager number of primary electron beams.

The radiation source arrangement 53 comprises a cathode plate 57 oriented in the xy-plane made, for example, of a semiconductor material on which two projections 112 of about pyramided shape are formed such that they project as tips downwards in z-direction from the cathode plate 57. Above the cathode plate 57, there are disposed two schematically shown radiation sources, such as, lasers 115, for example. The light beams 117 emitted therefrom are directed from above into the projections 112 in order for electrons to be emitted at the projections 112 as a result of a photon-supported field emission. In z-direction below the cathode plate 57, there is disposed an anode plate with beam shaping recesses 63, the circular recesses 63 being in alignment with the projections 112 in z-direction. An electric field applied by a voltage source 121 between the cathode plate 57 and the anode plate 59 extracts, by photon-supported field emission, electrons from the projections 112 of the regions of the cathode plate 57 illuminated by the laser beams 117 in order to shape primary electron beams 55.

In the above-described embodiments, the comb lenses serve to displace the beams towards the central axis 15 of the comb lens. However, it is also possible to provide an electric field between the opposed rows of finger electrodes of the comb lens which is oriented transversely to the central axis 15 in order to also deflect the beams transversely to the longitudinal direction of the comb lens, i.e., the y-direction in FIGS. 1 to 13.

FIG. 14 schematically shows a lithography system 121. As far as its structure is concerned, it is similar to the microscopy apparatus of FIG. 10. However, the lithography system 121 comprises electron sources in a radiation source arrangement 53 as they have been described above with reference to FIG. 13. Light emitted by lasers 115 is focused by collimating lenses 123 and directed to projections 112 of an anode plate 57. Electrons are extracted there by photon-supported field emission in order to produce the primary electron beams 55. Other than the glow cathodes according to FIG. 10, the electron sources can be quickly switched on in the lithography system according to FIG. 14 so that the primary electron beams 55 can also be quickly switched on and off.

In an object plane 25, there is disposed a surface of a wafer 125 which is coated with a lacquer (resist) which is sensitive to particle radiation. The beam deflectors 75, 77, 91 and 93 are controlled by a controller 103 in order to move the primary electron beams 55 across the object surface 25 for writing a pattern on the particle-sensitive lacquer. To this end, the lasers 115 are likewise controlled by the controller 103 to switch the beams 55 on and off as required.

In the lithography system 121 shown in FIG. 14, it is possible to detect secondary electrons with the detector 73 which have been extracted by the writing beams 55 from the particle-sensitive lacquer, as it has already been described in connection with the microscopy apparatus according to FIG. 10. This offers the advantage to monitor the writing of the pattern on the wafer 125 by the writing beams 55. If such a monitoring of the written pattern directly during the writing procedure is not necessary, the detector 73 as well as the magnetic coils 97 for guiding the secondary electrons can thus also be omitted in the lithography system 121.

In the microscopy apparatuses described with reference to FIGS. 8, 9 and 10 and in the lithography apparatus described with reference to FIG. 14, beam deflectors 75, 77 are formed by pairs 79, 80 of deflecting electrodes, a separate pair of deflecting electrodes 79, 80 being provided for each primary electron beam 55. As an alternative thereto, it is possible to replace each deflecting arrangement 75, 77 by a beam changing arrangement 1 whose finger electrodes are controlled such that in the region of each primary electron beam an electric deflecting field is present as it has been described with reference to FIG. 4.

In the microscopy apparatuses described with reference to FIGS. 8, 9 and 10 and in the lithography apparatus described with reference to FIG. 14, comb lenses 11 have been respectively used in the beam changing arrangements, each of which provides an electric field in the opening thereof. As an alternative thereto, it is, however, also possible to use comb lenses which provide magnetic fields in the openings thereof, as it has been described with reference to FIG. 5.

In FIGS. 3, 4, 6 and 7 beam paths and field configurations have been depicted in simplified manner to the effect that the fields are schematically limited to an xy-plane and the beams are correspondingly "bent" in this plane and extend straightly outside of the plane. In reality, however, the fields are extended in z-direction about the plane and, accordingly, the beams will not perceive their deflection as bent but as steady curve.

The above-described applications relate to electron beams, but are not restricted thereto and can also be applied to other kinds of beams of charged particles, such as ion beams or myon beams, for example.

The above-described secondary electrons comprise all types of electrons which can be extracted by a primary beam from an object or which can be caused by such a primary beam at the object. In particular, the term "secondary electrons" comprises within the scope of the present application also mirror electrons which are primary electrons reflected at the object which do not fully reach the surface of the object as well as, furthermore, back scattering electrons which are electrons emitted from the surface of the object which have substantially the same kinetic energy as the primary electrons directed to the object as well as, furthermore, secondary electrons in the narrower sense, that is, electrons emitted from the object which have a lower kinetic energy than the primary electrons directed to the object. Furthermore, secondary electrons within the scope of the present application are also electrons which are extracted from the object, for example, by irradiation of ions or other particles.

Other changes and modifications will occur to those skilled in the art that do not depart from the present invention as recited in the appended claims. The invention is not limited to the exemplary embodiments described herein.

What is claimed is:

1. A particle-optical arrangement, comprising:
a beam changing arrangement for acting on a plurality of beams of charged particles, and
a beam guiding arrangement for supplying the plurality of beams to the beam changing arrangement such that they enter the beam changing arrangement offset from each other along a first direction,
wherein the beam changing arrangement comprises a comb lens having at least one row of a plurality of field source members for providing a common spatial region with at least one of an electric field and a magnetic field, for acting on the beams entering the common field region, and wherein the row extends in the first direction.

2. The particle-optical arrangement according to claim 1, wherein the field comprises in the common spatial region a quadrupole field which defocuses the beams in the first direction.

3. The particle-optical arrangement according to claim 1, further comprising a focusing device for focusing the beams in the first direction.

4. The particle-optical arrangement according to claim 3, wherein the focusing device generates for each beam a separate field comprising a quadrupole field.

5. The particle-optical arrangement according to claim 1, wherein the beam guiding arrangement comprises at least one beam deflector for displacing positions where the beams enter the beam changing arrangement in the first direction.

6. The particle-optical arrangement according to claim 5, wherein the beam deflector comprises a comb lens having at least one row of a plurality of field source members.

7. The particle-optical arrangement according to claim 5, wherein a main axis of the field generated in the common spatial region is displaceable in the first direction.

8. The particle-optical arrangement according to claim 1, wherein the electric field and magnetic field, respectively, each have a focusing effect on the beams.

9. The particle-optical arrangement according to claim 1, wherein the electric field and magnetic field, respectively, each have a beam-deflecting effect on the beams.

10. The particle-optical arrangement according to claim 1, wherein each field source member extends in a second direction oriented transversely to the first direction, and has a front face oriented towards a central axis of an aperture of the comb lens.

11. The particle-optical arrangement according to claim 1, further comprising a driver arrangement for controlling source strengths of the individual field source members.

12. The particle-optical arrangement according to claim 11, wherein the field source members are sources of electric fields and wherein the driver arrangement is configured to supply adjustable electric voltages to the field source members.

13. The particle-optical arrangement according to claim 11, wherein the field source members are sources of magnetic fields, and wherein the driver arrangement is configured to supply adjustable electric currents to plural windings allocated to the field source members.

14. The particle-optical arrangement according to claim 1, wherein a number of the field source members in each one of the rows is higher or equal to two times the number of the beams.

15. A particle-optical deflecting arrangement for deflecting at least one beam of charged particles, wherein the particle-optical deflecting arrangement comprises:
a comb lens having at least one row of a plurality of field source members, the row extending in the first direction, and
a driver arrangement for controlling source strengths of the individual field source members such that at least a dipole field is generated in a field region passed by the beam, the dipole field deflecting the beam, wherein the field region with the beam-deflecting dipole field extends merely over a portion of a length of the row.

16. The particle-optical deflecting arrangement according to claim 15, wherein the driver arrangement is configured for controlling the source strengths of the individual field source members such that a round lens field for focusing the beam is generated in the field region, wherein the round lens field is superimposed with the dipole field.

17. The particle-optical deflecting arrangement according to claim 15, wherein the driver arrangement is configured for controlling the source strengths of the individual field source members such that a quadrupole field for focusing the beam in the first direction or/and transversely to the first direction is generated in the field region, wherein the quadrupole field is superimposed with the dipole field.

18. The particle-optical deflecting arrangement according to claim 15, wherein the driver arrangement is configured for controlling the source strengths of the individual field source members such that a field with a higher order than a quadrupole order is generated in the field region, wherein the field with the higher order than the quadrupole order is superimposed with the dipole field.

19. A particle-optical arrangement, comprising:
a first beam guiding arrangement for focusing a plurality of probe beams of charged particles substantially in an object plane,
a detector arrangement for detecting intensities of secondary particles,
a second beam guiding arrangement for guiding the secondary particles emanating from a region about the object plane as secondary beams to the detector arrangement,
wherein the detector arrangement comprises a position-sensitive detector having a plurality of detector elements, wherein at least one of the secondary beams is guided to plural detector elements.

20. The particle-optical arrangement according to claim 19, wherein the detector arrangement is configured such that a secondary particle intensity corresponding to each of the probe beams is detectable.

21. The particle-optical arrangement according to claim 19, wherein the detector arrangement comprises a controller configured to combine intensities detected by detector elements in regions of the detector allocated to a respective probe beam and to output the combined intensities as the secondary particle intensities.

22. The particle-optical arrangement according to claim 19, wherein the beam changing apparatus comprises at least one beam deflector for displacing positions where the probe beams are focused in the object plane.

23. The particle-optical arrangement according to claim 22, wherein the controller is configured to change the regions of the detector dependent upon the displacement of the positions where the probe beams are focused in the object plane.

24. The particle-optical arrangement according to claim 19, wherein the detector arrangement comprises at least one aperture for the probe beam to pass through.

25. The particle-optical arrangement according to claim 19, wherein the beam guiding arrangement comprises at least one beam separator for separating the beam path of the probe beams and the beam path of the secondary beams from each other.

26. A particle-optical arrangement, comprising:
a first beam guiding arrangement for focusing a plurality of probe beams of charged particles substantially in an object plane,
a detector arrangement for detecting intensities of secondary particles, and
a second beam guiding arrangement for guiding the secondary particles emanating from a region about the object plane as secondary beams to the detector arrangement,
wherein the second beam guiding arrangement comprises an objective arrangement for focusing the probe beams in the object plane, wherein the secondary beams pass through the objective arrangement,
wherein the second beam guiding arrangement comprises at least one beam deflector, wherein the secondary beams pass through the beam deflector,
and wherein the beam deflector and the objective arrangement are integrally formed in that they comprise at least one common comb lens having at least one row of a plurality of field source members.

27. The particle-optical arrangement according to claim 26, wherein the first beam guiding arrangement comprises a collimating arrangement for collimating the probe beams.

28. The particle-optical arrangement according to claim 26, wherein the first beam guiding arrangement comprises at least one beam deflector, and wherein the beam deflector and the collimating arrangement are integrally formed in that they comprise at least one comb lens having at least one row of a plurality of field source members.

29. A particle-optical arrangement, comprising:
a beam changing arrangement for acting on a plurality of beams of charged particles, and
a beam guiding arrangement for supplying the plurality of beams to the beam changing arrangement such that they enter the beam changing arrangement along predetermined beam axes as separate beams spaced apart from each other,
wherein the beam changing arrangement comprises a comb lens having at least one row of a plurality of field source members for providing for each beam a separate spatial region with at least one of an electric field and a magnetic field, for acting on the beam entering the respective region.

30. The particle-optical arrangement according to claim 29, wherein the beam guiding arrangement comprises a beam source arrangement with a plurality of beam sources, wherein each one of the beam sources generates one of the beams of charged particles, and wherein the beam source arrangement comprises a row of plural aperture stops which are fixedly disposed with respect to the beam changing arrangement.

31. A beam guiding arrangement for providing a beam path for at least one beam of charged particles, the arrangement comprising:
a beam source arrangement with at least one beam source for generating the at least one beam of charged particles,
a first particle-optical deflecting arrangement according to claim 15 for collimating the beam generated by the beam source arrangement and for deflecting the same at an adjustable first angle,
a second particle-optical deflecting arrangement according to claim 15 for focusing the beam collimated by the first beam changing arrangement and for deflecting the same at an adjustable second angle.

32. The beam guiding arrangement according to claim 31, wherein the beam path between the first and second beam changing arrangements is a telescopic beam path.

33. A microscopy system for inspecting an object, comprising a particle-optical arrangement according to one of claims 1–14 or 19–30.

34. A lithography system for transferring a pattern onto a particle-sensitive substrate with at least one writing beam of charged particles, the system comprising a particle-optical arrangement according to one of claims 1–14 or 19–30.

35. A lithographic method comprising:
transferring a pattern onto a particle-sensitive substrate with at least one writing beam, wherein secondary electrons are released from the particle-sensitive substrate by the at least one writing beam and emanate from the particle-sensitive substrate; and detecting the secondary electrons having emanated from the particle-sensitive substrate with at least one electronic detector.

36. The lithographic method according to claim 35, wherein the pattern is transferred to the particle-sensitive substrate with a plurality of writing beams, and wherein a secondary electron intensity corresponding to each one of the writing beams is detected.

37. A microscopy system for inspecting an object, comprising a beam-guiding arrangement according to one of claims 31 and 32.

38. A microscopy system for inspecting an object, comprising a particle-optical deflecting arrangement according to one of claims 15–18.

39. A lithography system for transferring a pattern onto a particle-sensitive substrate with at least one writing beam of charged particles, the system comprising a beam-guiding arrangement according to one of claims 31 and 32.

40. A lithography system for transferring a pattern onto a particle-sensitive substrate with at least one writing beam of charged particles, the system comprising a particle-optical deflecting arrangement according to one of claims 15–18.

* * * * *

UNITED STATES PATENT AND TRADEMARK OFFICE
CERTIFICATE OF CORRECTION

PATENT NO.   : 6,878,936 B2
DATED        : April 12, 2005
INVENTOR(S)  : Oliver Kienzle et al.

It is certified that error appears in the above-identified patent and that said Letters Patent is hereby corrected as shown below:

<u>Title page,</u>
Item [30], Foreign Application Priority Data, should read:
-- Jul. 18, 2002 (DE) .............................. 102 32 689 --.

Signed and Sealed this

Thirtieth Day of August, 2005

JON W. DUDAS
*Director of the United States Patent and Trademark Office*